United States Patent
Ko et al.

(10) Patent No.: US 11,827,975 B2
(45) Date of Patent: Nov. 28, 2023

(54) PHOTOPLASMA ETCHING APPARATUS HAVING IMPROVED PLASMA-RESISTANT AND MANUFACTURING METHOD THEREFOR USING A THERMAL DIFFUSION PHENOMENON OF A RARE-EARTH METAL THIN FILM

(71) Applicant: KOMICO LTD., Anseong-si (KR)

(72) Inventors: Hyunchul Ko, Anseong-si (KR); Suntae Kim, Bucheon-si (KR); Donghun Jeong, Pyeongtaek-si (KR)

(73) Assignee: KOMICO LTD., Anseong-si (KR)

( * ) Notice: Subject to any disclaimer, the term of this patent is extended or adjusted under 35 U.S.C. 154(b) by 607 days.

(21) Appl. No.: 16/647,211

(22) PCT Filed: Jul. 17, 2018

(86) PCT No.: PCT/KR2018/008074
§ 371 (c)(1),
(2) Date: May 1, 2020

(87) PCT Pub. No.: WO2019/054617
PCT Pub. Date: Mar. 21, 2019

(65) Prior Publication Data
US 2020/0354827 A1 Nov. 12, 2020

(30) Foreign Application Priority Data
Sep. 14, 2017 (KR) .................. 10-2017-0117841

(51) Int. Cl.
*C23C 14/30* (2006.01)
*C23C 14/58* (2006.01)
(Continued)

(52) U.S. Cl.
CPC ........ *C23C 14/5806* (2013.01); *C23C 14/185* (2013.01); *C23C 14/30* (2013.01);
(Continued)

(58) Field of Classification Search
CPC ....... C23C 14/30; C23C 14/34; C23C 14/185; C23C 14/5806
See application file for complete search history.

(56) References Cited

U.S. PATENT DOCUMENTS 5,118,387 A * 6/1992 Kadomura ........ H01L 21/32137
438/715
8,129,029 B2 * 3/2012 Sun ..................... C23C 16/4404
428/472
(Continued)

FOREIGN PATENT DOCUMENTS

CN 1804083 A * 7/2006 ............. C22C 23/06
JP 1-111718 * 4/1989 ............... C01G 3/00
(Continued)

OTHER PUBLICATIONS

Olsen, T., et al., "Co-sputtering yttrium into hafnium oxide thin films to produce ferroelectric properties". Appl. Phys. Lett. 101, 082905 (2012) pp. 1-4.*

(Continued)

*Primary Examiner* — Bret P Chen
(74) *Attorney, Agent, or Firm* — STIP Law Group, LLC

(57) ABSTRACT

The present invention provides a photoplasma etching device and a method of manufacturing the same, and more particularly to a member for a plasma etching device, which is improved in plasma resistance through deposition of a rare-earth metal thin film and surface heat treatment and the optical transmittance of which is maintained, thus being useful as a member for analyzing the end point of an etching process, and a method of manufacturing the same.

6 Claims, 7 Drawing Sheets

(51) Int. Cl.
*C23C 14/18* (2006.01)
*C23C 14/34* (2006.01)
*H01L 21/67* (2006.01)
*H01J 37/32* (2006.01)

(52) U.S. Cl.
CPC ........ *C23C 14/34* (2013.01); *H01L 21/67069* (2013.01); *H01J 37/32642* (2013.01); *H01J 2237/0203* (2013.01); *H01J 2237/334* (2013.01)

(56) References Cited

U.S. PATENT DOCUMENTS

| | | | |
|---|---|---|---|
| 8,247,080 B2* | 8/2012 | Iacovangelo | C04B 41/009 427/248.1 |
| 2006/0157198 A1* | 7/2006 | Furuse | H01J 37/3255 156/914 |
| 2006/0160335 A1* | 7/2006 | Li | H01L 21/0259 257/E21.094 |
| 2006/0261516 A1* | 11/2006 | Kunitake | C23C 18/1275 257/E21.29 |
| 2007/0022595 A1* | 2/2007 | Kopras | B25F 5/026 29/560 |
| 2007/0159171 A1* | 7/2007 | Komuro | G01R 33/3806 324/318 |
| 2008/0050581 A1* | 2/2008 | Miwa | C23C 22/73 427/255.19 |
| 2009/0152652 A1* | 6/2009 | Nishi | H01L 29/665 438/301 |
| 2009/0212010 A1* | 8/2009 | Wang | H01L 21/31116 216/41 |
| 2013/0135069 A1* | 5/2013 | Miyamoto | C23C 14/16 419/27 |
| 2014/0377504 A1 | 12/2014 | Sun et al. | |
| 2015/0194259 A1* | 7/2015 | Sun | C23C 28/321 419/5 |
| 2015/0294787 A1* | 10/2015 | Zlatkov | C22C 38/005 310/156.01 |
| 2016/0190346 A1* | 6/2016 | Kawata | H01J 37/3447 257/43 |
| 2016/0203892 A1* | 7/2016 | Lee | B22F 5/00 419/27 |
| 2016/0343482 A1* | 11/2016 | Nakano | C22C 33/003 |
| 2018/0135157 A1* | 5/2018 | Jeong | C23C 4/123 |

FOREIGN PATENT DOCUMENTS

| | | | | |
|---|---|---|---|---|
| JP | 6-287100 | * | 10/1994 | ............. C30B 29/22 |
| JP | 6-299354 | * | 10/1994 | ............. C23C 14/58 |
| JP | 2001240482 A | | 9/2001 | |
| JP | 2016188160 A | | 11/2016 | |
| KR | 100689889 B1 | | 3/2007 | |
| KR | 100727672 B1 | | 6/2007 | |
| KR | 101108692 B1 | | 1/2012 | |
| KR | 101183021 B1 | | 9/2012 | |

OTHER PUBLICATIONS

Mao, Y., et al., "The influence of annealing on yttrium oxide thin film deposited by reactive magnetron sputtering: Process and microstructure". Nuclear Materials and Energy 10 (2017), pp. 1-8.*

Mongstad, T., et al., "Transparent yttrium hydride thin films prepared by reactive sputtering". Journal of Alloys and Compounds, 2018, pp. 1-7.*

Goto, Tetsuya, et al., "Observation of sputtering of yttrium from Y2O3 ceramics by low-energy Ar, Kr, and Xe ion bombardment in microwave-excited plasma". 2015 Jpn. J. Appl, Phys, 54, 128003, pp. 1-3.*

Lin, Tzu-Ken, et al., "Comparison of Erosion Behavior and Particle Contamination in Mass-Production CF4/O2 Plasma Chambers Using Y2O3 and YF3 Protective Coatings". Nanomaterials, 2017, 7, 183, pp. 1-9.*

De Campos, Marcus Flavio, et al., "Optimizing the Heat Treatment of Rare Earth-Transition Metal Sintered Magnets". Materials Science Forum, vol. 660-661, Trans Tech Publications, Ltd., Oct. 2010, pp. 290-295. Abstract Only.*

International Search Report of PCT/KR2018/008074, dated Nov. 8, 2018, English translation.

Kirk Feral, Magnetism in Gemstones An Effective Tool and Method for Gem Identification, Sapphire Magnetism, 2014, pp. 1-16, https://www.gemstonemagnetism.com/sapphire_and_ruby.

* cited by examiner

[Fig. 1]
[Fig. 2]
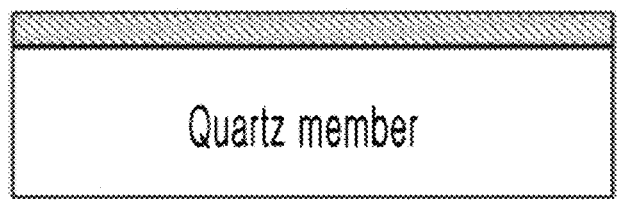
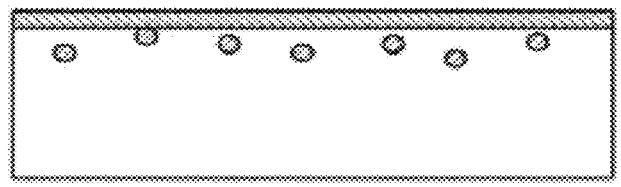
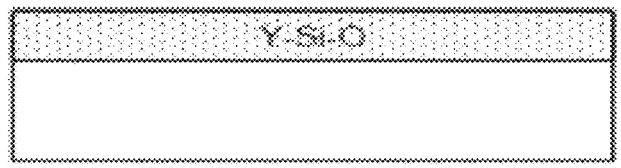

[Fig. 3A]
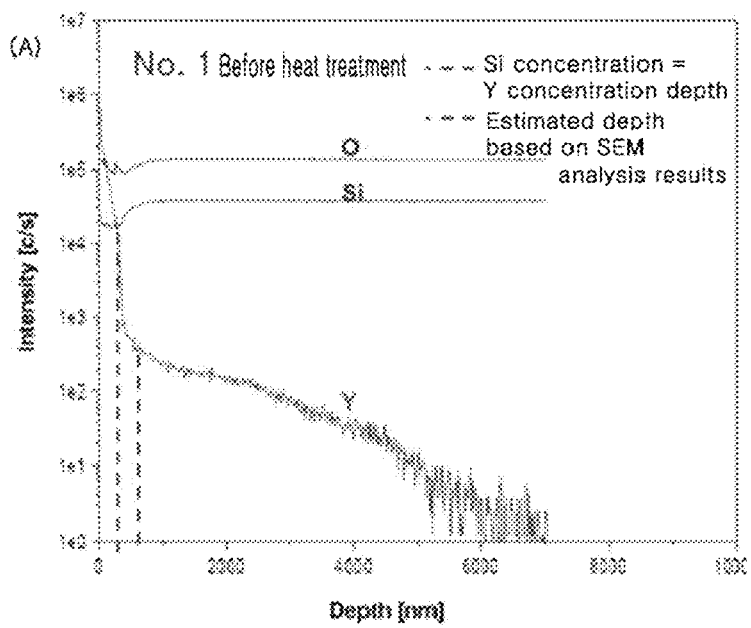
[FIG. 3B]
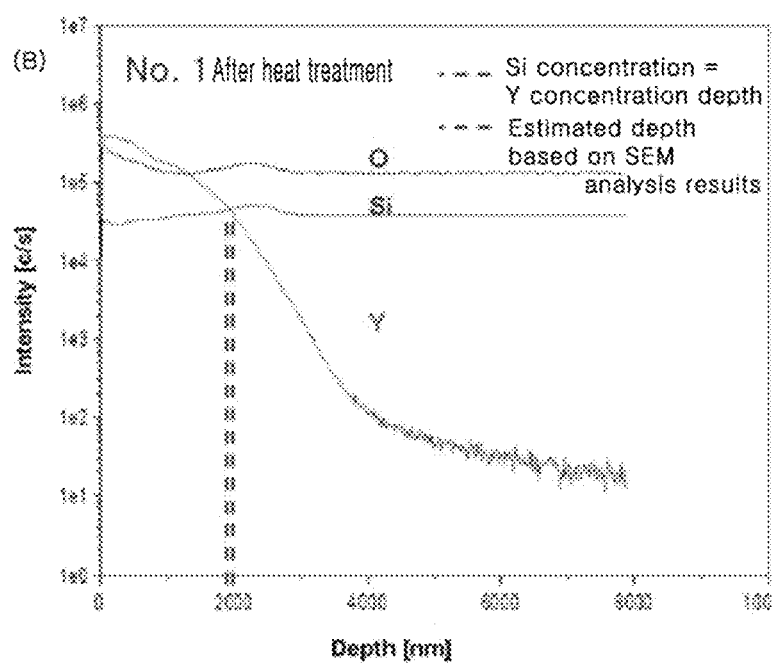

[Fig. 4A]
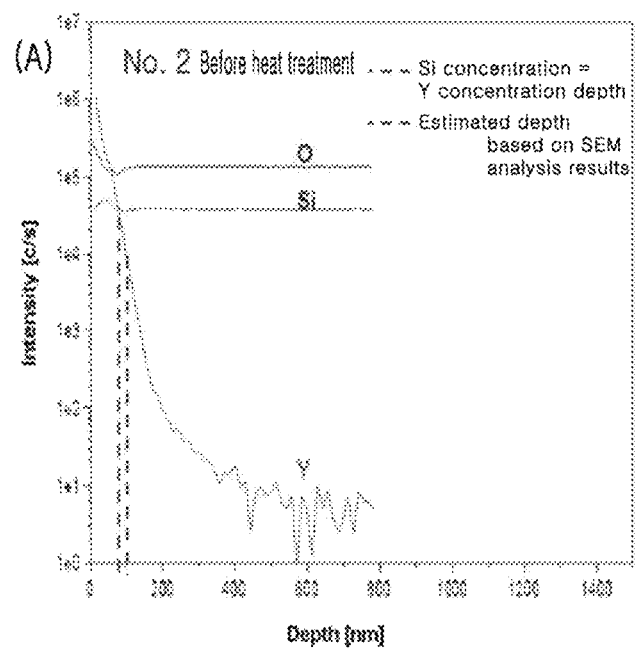
[FIG. 4B]
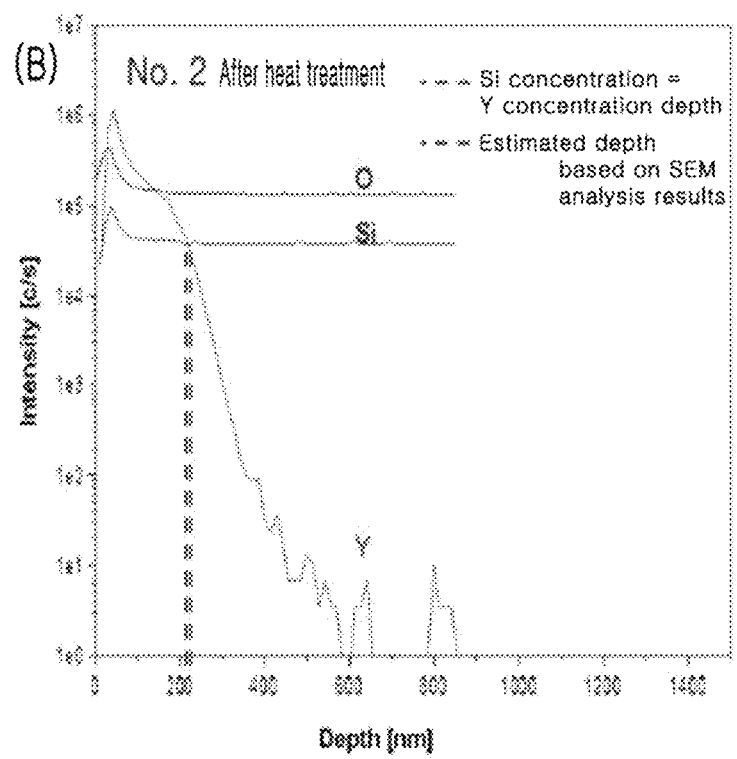

[Fig. 5A]
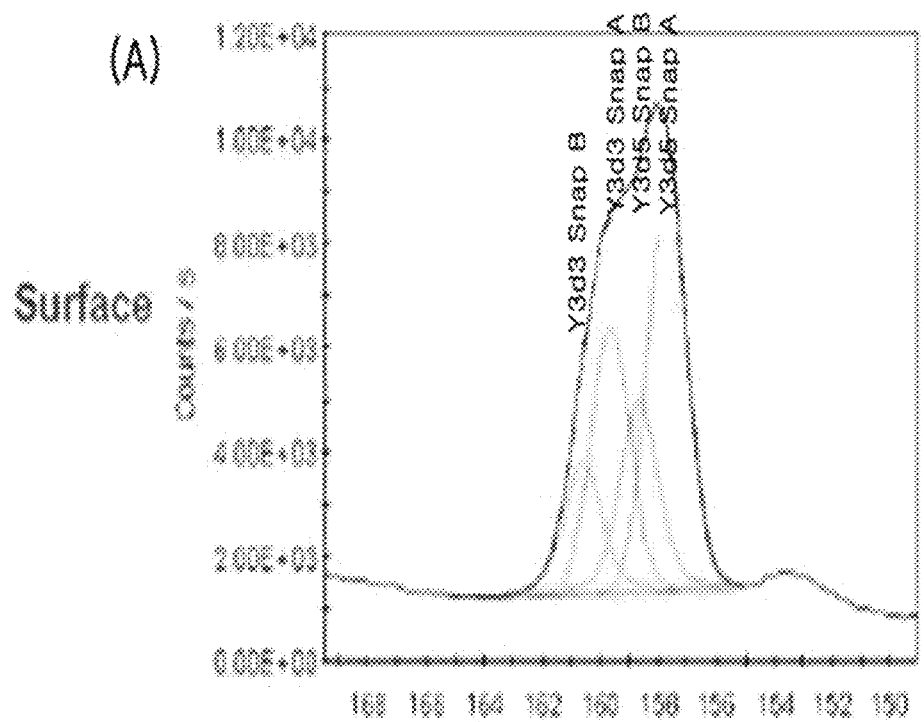
[Fig. 5B]
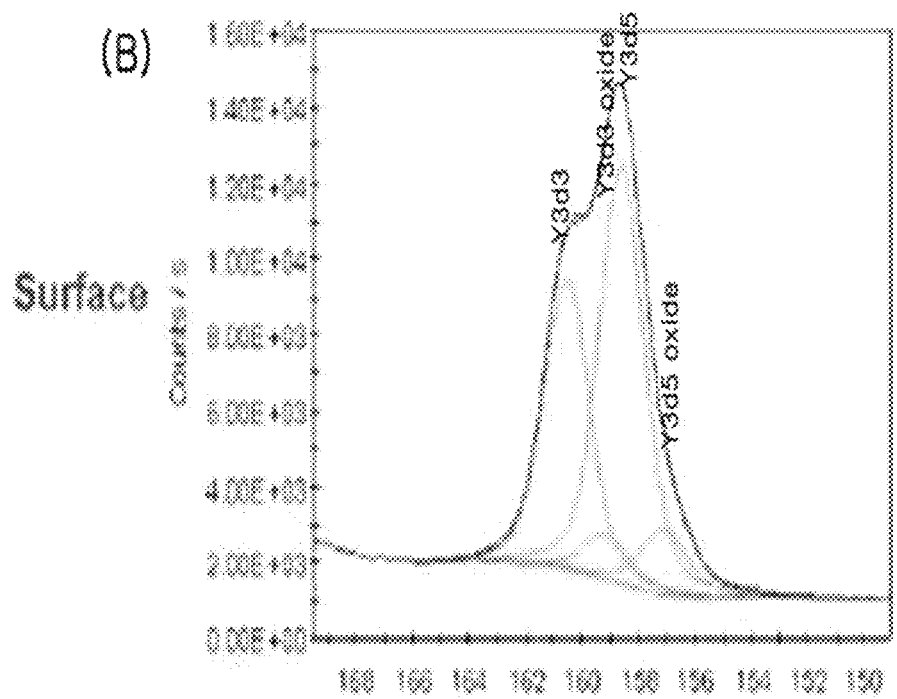

[Fig. 5C]
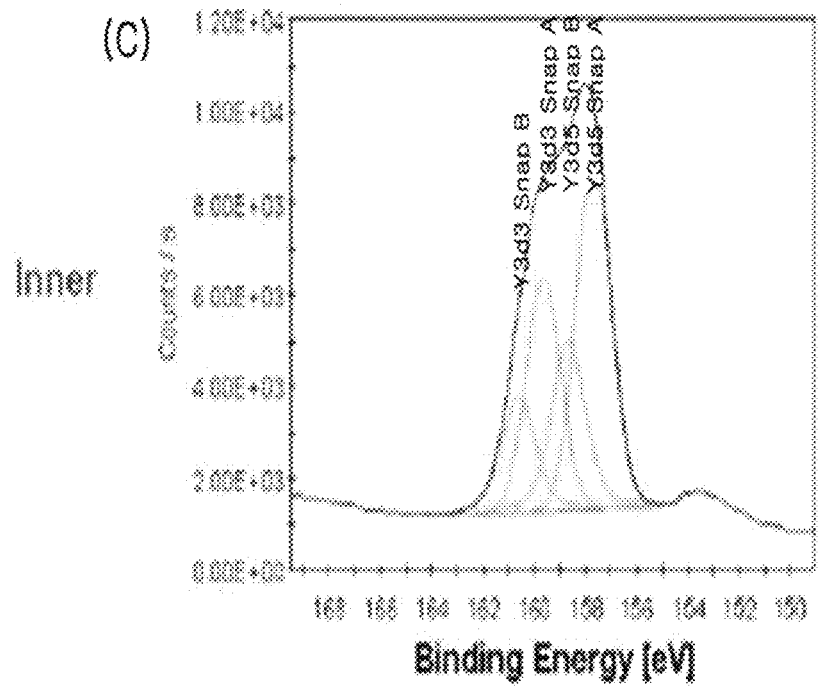
[Fig. 5D]
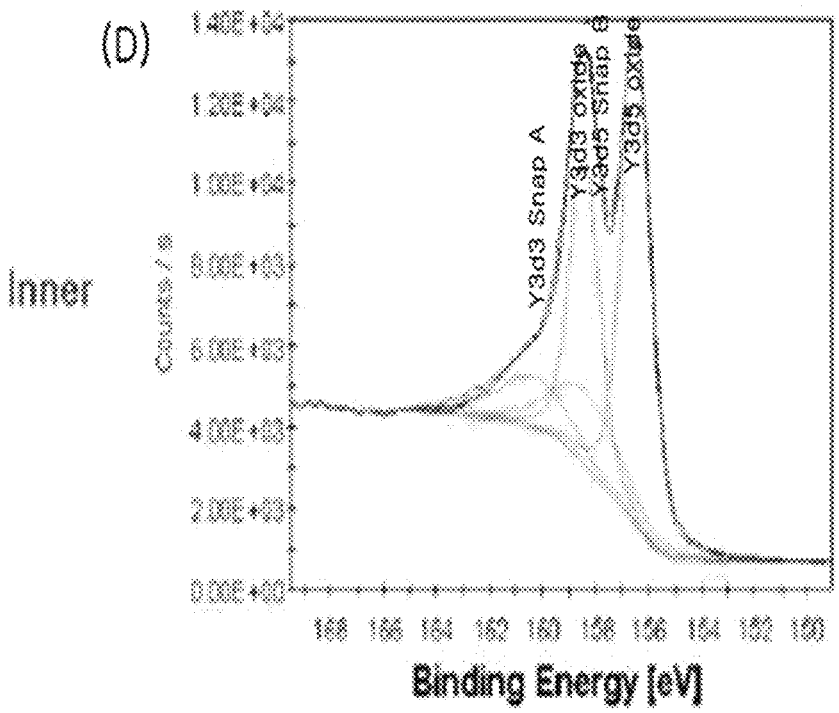

[Fig. 6A]
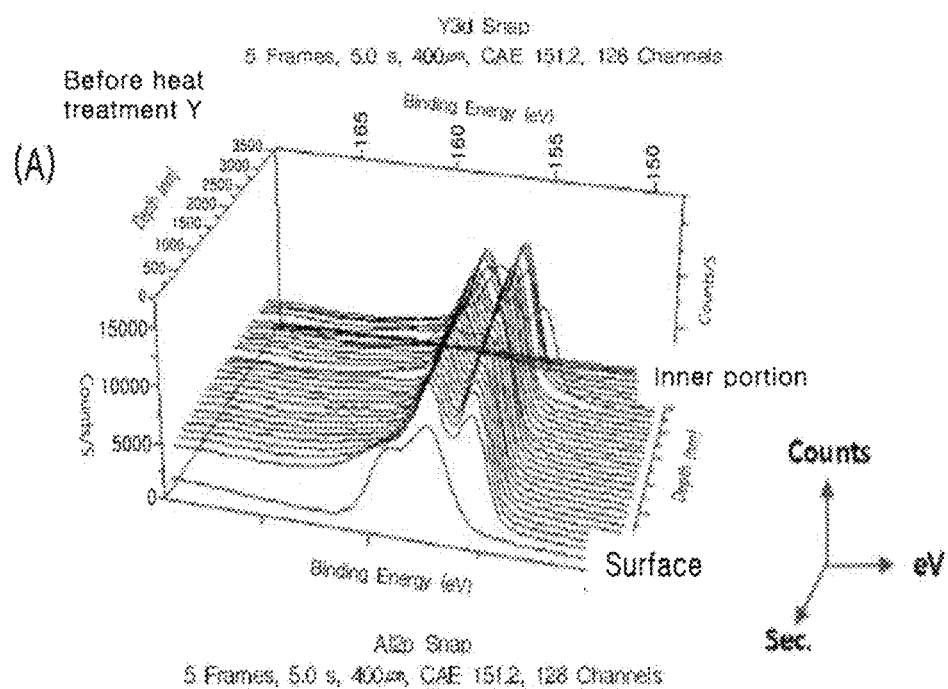
[Fig. 6B]
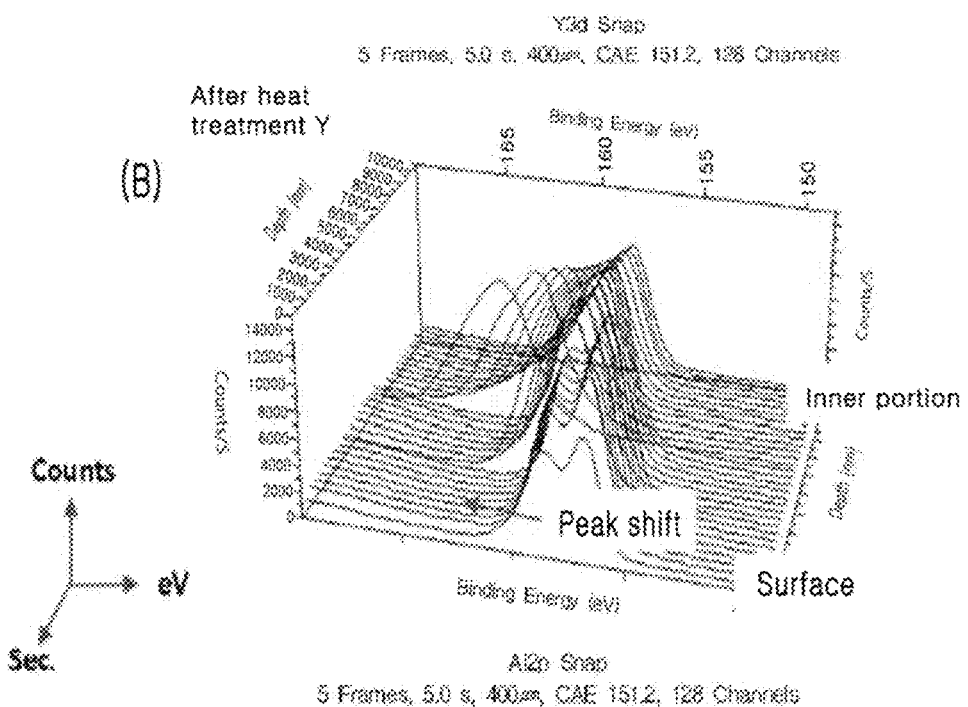

[Fig.6C]
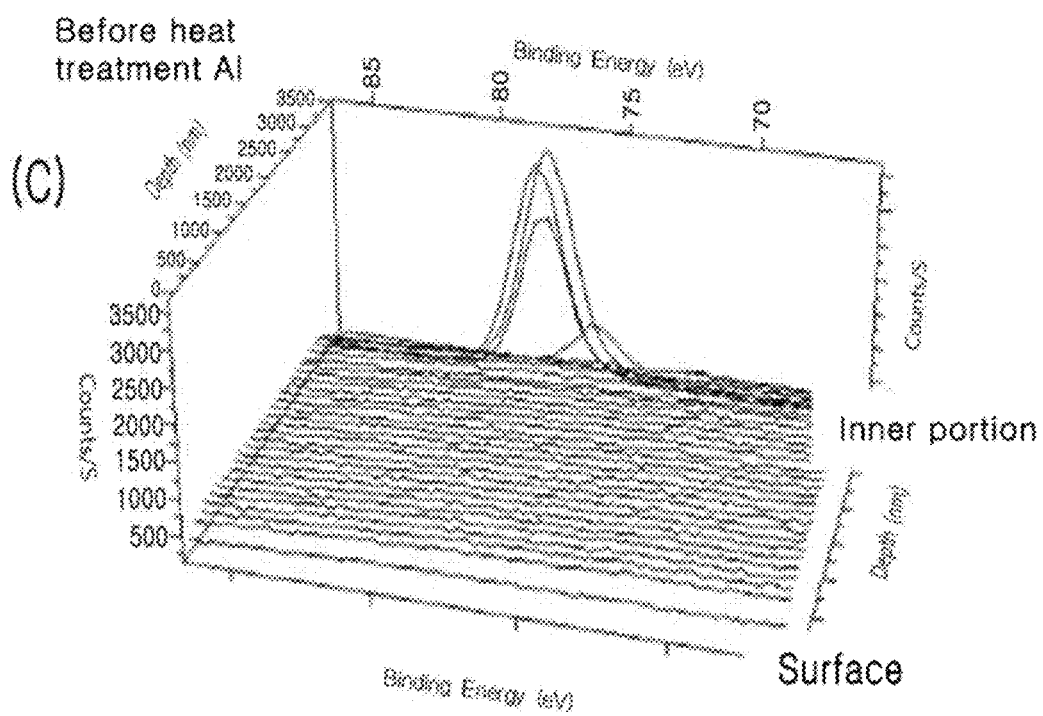
[Fig.6D]
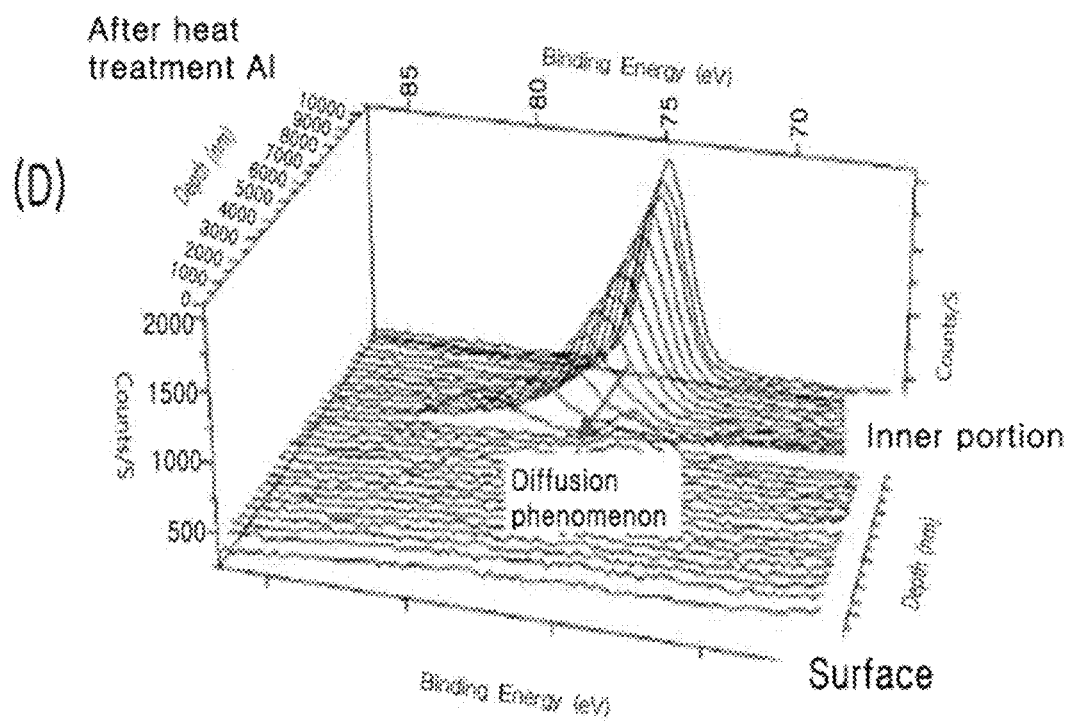

PHOTOPLASMA ETCHING APPARATUS HAVING IMPROVED PLASMA-RESISTANT AND MANUFACTURING METHOD THEREFOR USING A THERMAL DIFFUSION PHENOMENON OF A RARE-EARTH METAL THIN FILM

CROSS-REFERENCE TO RELATED APPLICATIONS

This application is the U.S. National Phase under 35 U.S.C. § 371 of International Application No. PCT/KR2018/008074 filed on Jul. 17, 2018, which in turn claims the benefit of Korean Application No. 10-2017-0117841, filed on Sep. 14, 2017, the disclosures of which are incorporated by reference into the present application.

TECHNICAL FIELD

The present invention relates to a member for a photoplasma etching device and a method of manufacturing the same, and more particularly to a technique for improving the plasma resistance of a member for a plasma etching device using a thermal diffusion phenomenon of a rare-earth metal thin film.

BACKGROUND ART

In order to perform fine processing for the high circuit integration of a substrate such as a silicon wafer during the manufacture of a semiconductor, a plasma dry-etching process is becoming more and more important.

Since a plasma etching process makes the vertical etching rate much larger than the horizontal etching rate, the aspect ratio of the resultant etched pattern may be appropriately controlled. The practical application of a plasma etching process enables the formation of a very fine pattern having a large aspect ratio on a film having a thickness of about 1 µm.

The chamber environment in a device for performing the dry etching process requires increased cleanliness as the processing level becomes finer. However, in various processes for fine processing, gases having strong corrosive properties, such as fluorides, chlorides, etc., are used, and these process gases have a problem of corrosion not only of the wafer but also of the interior of the chamber.

For use in such an environment, materials having high plasma resistance are employed in the chamber member. Typical examples thereof include alumite, sintered alumina, quartz members and the like.

Among these, quartz members are used despite the high dry-plasma-etching rate relative to other materials, which is due to a special purpose. The application for which the quartz member is most frequently used is an edge ring surrounding the wafer. It is advantageous for the region around the wafer to be an electrical environment similar to that of a silicon wafer, and a byproduct that may occur during the etching process is $SiF_4$ (silicon fluoride), which is easily vaporized compared to other materials. The use of such an easily vaporized material has little effect on the yield of the wafer, so quartz members are used for most edge rings.

Another use example of the quartz member is an endpoint analysis member, which is an accessory that controls the material to be etched to a desired depth by analyzing a wavelength generated during the etching process. A material suitable for observing the inside of the device has to be a transparent material, and the transparency of quartz is perfectly appropriate for the purpose. However, the plasma resistance of quartz is much lower than that of other materials, and there is a problem in that the member needs to be replaced after long-term use.

With the goal of solving such problems, various methods have been discussed in the related art. As for the quartz member for a plasma etching device, a method of performing coating after melting with an oxyhydrogen flame or a method of performing heat-melting after coating with a solution that dissolves yttrium or an yttrium compound or YAG is used to increase plasma resistance. Moreover, plasma thermal-spraying, high-speed flame thermal-spraying, aerosol deposition and the like have come to be used in recent years due to the development of thermal-spraying technology applied to the field of semiconductors. However, these conventional techniques have some problems.

In particular, in the case of an edge ring surrounding a silicon wafer, among quartz members, when a film of a different material is formed to a thickness of 10 µm or more, it is subject to the risk of arc discharge due to the difference in electrical properties between the wafer and the gap. Moreover, there exists the likelihood of being required to change process parameters such as CD and EPD depending on a change in the dielectric value around the chamber.

In the plasma thermal-spraying process, which is mainly applied in recent years, the surface of the quartz member is subjected to a bead-blasting process to form roughness. Due to the physical impact, the surface of the quartz member is damaged, thus causing problems of cracking, fatigue failure, etc., which limited long-term reuse. Furthermore, there is a limitation in that a film having a thickness of 10 µm or less is not uniformly controlled.

Also, the thermal-spraying process is characterized by a quenching effect. Quartz, which is a material having a strong atomic bonding strength, is very weak to thermal shock. Thermal stress accumulates due to the quenching effect occurring in the thermal-spraying process, and deterioration of the properties of the material due to residual stress may also become problematic.

In aerosol deposition, which has been recently researched, it is technically possible to construct a film having a thickness of about 10 µm, but because of low adhesion due to simple mechanical engagement between the film and the surface, problems such as peeling and the like may occur during long-term use. Furthermore, the film is etched by $CF_4$ plasma ions and radicals used in the dry etching process to generate particles, which may contaminate the wafer.

Recently, the use of an amorphous plasma-resistant glass composition or silicon carbide has been proposed as a method of changing materials in a dry etching device manufacturer, but it is of limited usefulness because it is not reasonable in terms of cost.

Next, the related art in the field to which the technology of the present invention belongs will be briefly described, and then distinguishing technical matters of the present invention will be described.

Specifically, Korean Patent No. 10-0727672 (Jun. 5, 2007) pertains to a member for a plasma etching device, and more particularly to a member for a plasma etching device in which an yttrium oxide or YAG film having a thickness of 10 µm or more, a thickness variation of 10% or less and preferably a surface roughness Ra of 1 µm or less is formed on the surface of the member including quartz glass, aluminum, alumite or combinations thereof, and to a technique for forming an yttrium oxide or YAG film having a thickness of 10 µm or more, a thickness variation of 10% or less and preferably a surface roughness Ra of 1 μm or less on the surface of the member using any one process selected from among a process of plasma thermal-spraying yttrium oxide or YAG, a coating process performed after melting yttrium oxide or YAG powder using an oxyhydrogen flame, a heat-melting process performed after coating with a solution that dissolves yttrium or an yttrium compound or YAG, and combinations thereof.

In addition, Korean Patent No. 10-0689889 (Feb. 26, 2007) pertains to a plasma-resistant quartz glass and a method of manufacturing the same, and particularly to, as a jig material for plasma reaction used for manufacturing a semiconductor, quartz glass, which has high plasma corrosion resistance, especially high corrosion resistance to fluorine-based plasma gas, and may be used without causing abnormalities on silicon wafers, and to a quartz glass jig and a method of manufacturing the same. As for the quartz glass containing 0.1 to 20 wt % of the sum of two or more types of metal elements, the metal element composition includes at least one first metal element selected from the group consisting of Group 3B elements in the periodic table and at least one second metal element selected from the group consisting of Mg, Ca, Sr, Ba, Sc, Y, Ti, Zr, Hf, lanthanoids and actinoids, the maximum concentration of the second metal element being 2.0 wt % or less to thus increase corrosion resistance.

However, the plasma-resistant members of the related documents also have the same technical limitations as the above-mentioned thermal-spraying process and the like, and the case of a doped quartz glass member manufactured by heating and melting after mixing with a heterogeneous element is uneconomical due to the content of the heterogeneous element.

The present inventors have encountered limitations in the aforementioned methods of forming films and of changing materials, and have thoroughly studied techniques of manufacturing a member for a plasma etching device having high plasma resistance through a continuous process of performing metal film deposition and heat treatment in order to propose a method of effectively increasing plasma resistance through surface modification, thus culminating in the present invention.

DISCLOSURE

Technical Problem

An objective of the present invention is to provide a method of manufacturing a member for a plasma etching device, which may be used for the end-point analysis of an etching process by maintaining optical transmittance as well as improving plasma resistance during semiconductor processing.

Another objective of the present invention is to provide a member for a plasma etching device having improved optical transmittance and plasma resistance using the method of manufacturing the member for a plasma etching device.

Technical Solution

In order to accomplish the above objectives, an embodiment of the present invention provides a method of manufacturing a member for a plasma etching device including a) depositing a rare-earth metal thin film at a thickness of 0.01 μm to 2.0 μm on a substrate through vacuum deposition and b) subjecting the substrate having the rare-earth metal thin film deposited thereon to heat treatment at 1000° C. to 2000° C. for 2 to 40 hr in an atmosphere of ambient air, nitrogen, oxygen or argon.

In a preferred embodiment of the present invention, the vacuum deposition may be electron-beam physical vapor deposition (EBPVD) or sputtering.

In a preferred embodiment of the present invention, the rare-earth metal may be at least one selected from among yttrium, ytterbium, and samarium.

In a preferred embodiment of the present invention, the material for the substrate may have a melting point of 1000° C. or more.

In a preferred embodiment of the present invention, the substrate may include any one selected from among quartz, sintered alumina, and sapphire.

In a preferred embodiment of the present invention, the heat treatment in step b) may be performed for 2 to 20 hr.

Another embodiment of the present invention provides a member for a plasma etching device, which is manufactured by the above method and in which a thickness of a thermal diffusion layer of a rare-earth metal is 0.1 μm to 10 μm.

Still another embodiment of the present invention provides a member for a plasma etching device, which is manufactured by the above method, in which a thickness of a thermal diffusion layer of a rare-earth metal is 0.1 μm to 10 μm, and which is transparent.

Advantageous Effects

According to the present invention, the member for a plasma etching device has no change in electrical properties (breakdown voltage and dielectric value) due to the doping effect of a rare-earth metal, thus minimizing the likelihood of being required to change process parameters. Moreover, there is no risk of peeling or the like due to chemical bonding using a thermal diffusion process, and the thermal stress of the material can be relieved due to the heat treatment effect, thus preventing deterioration of physical properties of the material, and moreover, transparency is maintained through atmospheric heat treatment after deposition, thus retaining the inherent optical properties of the member, whereby the member of the present invention can be utilized as an existing end-point analysis member, etc.

In addition, the manufacturing method of the present invention is advantageous in that it is reasonable in terms of cost and time through simple deposition and heat treatment and does not include a pretreatment process that causes physical damage, such as a bead-blasting process.

BRIEF DESCRIPTION OF DRAWINGS

FIG. 1 schematically shows an edge ring member for a plasma etching device;

FIG. 2 shows a process of forming a rare-earth metal thick film in order to increase the plasma resistance of a member for a plasma etching device according to the present invention;

FIG. 3A and FIG. 3B show the results of SIMS of the elemental analysis by depth (A) before heat treatment and (B) after heat treatment of Example 1;

FIG. 4A and FIG. 4B show the results of SIMS of the elemental analysis by depth (A) before heat treatment and (B) after heat treatment of Example 2;

FIG. 5A and FIG. 5B show the results of XPS of yttrium 3d orbitals present on the surface of the member (A) before heat treatment and (B) after heat treatment of Example 1;

FIG. 5C and FIG. 5D show the results of XPS of yttrium 3d orbitals present in the inner portion of the member (C) before heat treatment and (D) after heat treatment of Example 1;

FIG. 6A and FIG. 6B show the results of XPS of yttrium 3d orbitals by depth (A) before heat treatment and (B) after heat treatment of Example 3; and FIG. 6C and FIG. 6D show the results of XPS of aluminum 3d orbitals by depth (C) before heat treatment and (D) after heat treatment of Example 3.

MODE FOR INVENTION

Unless otherwise defined, all technical and scientific terms used herein have the same meanings as those typically understood by those skilled in the art to which the present invention belongs. Generally, the nomenclature used herein is well known in the art and is typical.

As used herein, when any part is said to "include" any element, this does not mean that other elements are excluded, and such other elements may be further included unless otherwise specifically mentioned.

In a process of manufacturing a semiconductor, a gate etching device, an insulating-film etching device, a resist-film etching device, a sputtering device, a CVD device and the like are used. Meanwhile, an etching device or the like for forming a thin-film transistor is used in the process of manufacturing a liquid crystal. Moreover, these manufacturing devices have a configuration provided with a plasma generator for the purpose of high integration through fine processing.

As a processing gas in these manufacturing processes, a halogen-based corrosive gas such as fluorine-based gas, chlorine-based gas, etc. is used for the above-described devices due to the high reactivity thereof. Examples of the fluorine-based gas include $SF_6$, $CF_4$, $CHF_3$, $ClF_3$, HF, $NF_3$, and the like, and examples of the chlorine-based gas include $Cl_2$, $BCl_3$, HCl, $CCl_4$, $SiCl_4$, and the like. When microwaves or radio waves are applied to an atmosphere to which these gases are introduced, these gases are converted to plasma. The device member exposed to the halogen-based gas or plasma thereof is required to have very low metal content, other than the material component on the surface thereof, and also to have high corrosion resistance, and thus the present invention aims to provide a method of manufacturing a member for a plasma etching device having high plasma resistance.

An aspect of the present invention pertains to a method of manufacturing a member for a plasma etching device including a) depositing a rare-earth metal thin film at a thickness of 0.01 μm to 2.0 μm on a substrate through vacuum deposition and b) subjecting the substrate having the rare-earth metal thin film deposited thereon to heat treatment at 1000° C. to 2000° C. for 2 to 40 hr in an atmosphere of ambient air, nitrogen, oxygen or argon.

A representative example of the member for a plasma etching device is an edge ring, and such an edge ring is schematically shown in FIG. 1. Moreover, the edge ring may be used not only for a plasma etching device, but also in a chamber for plasma PVD, CVD, ion implantation, and the like.

It is preferable that the melting point of the substrate material be 1000° C. or higher, and if the melting point of the substrate is lower than 1000° C., thermal damage to the substrate may occur during the heat treatment process. On the other hand, if the melting point is excessively high, sufficient thermal diffusion of the deposition material may not occur, making it impossible to control the diffusion depth, and high-temperature treatment for controlling this depth may cause deformation of the deposition material.

The substrate is mainly formed of an oxide ceramic, an oxidized metal or a metal, including at least one element (e.g. at least one element selected from among silicon and aluminum) selected from among Group 4 elements, Group 5 elements, Group 13 elements, and Group 14 elements in the periodic table. As a typical example of such a treatment member, at least one selected from among silica, glass, alumina, alumite, processed aluminum, silicon, and aluminum may be exemplified, and specifically, quartz, sintered alumina or sapphire is preferably used.

The quartz material may be selected from the group consisting of glass, synthetic silica, fused silica, fused quartz, high-purity quartz, quartz sand, and other silicon-containing materials suitable for forming quartz glass compositions. The quartz material may also be obtained through any suitable process.

In the present invention, any substrate may be used, so long as it has a melting point of 1000° C. or higher, and the use thereof as a material for a dry etching device chamber member used in a process of manufacturing a semiconductor becomes easy.

The vacuum deposition process may be electron-beam physical vapor deposition (EBPVD) or sputtering, and there is almost no difference in quality between the rare-earth metal thin films obtained as a result of the above two processes.

The electron-beam physical vapor deposition (EB-PVD) has a film-forming mechanism in a manner in which electrons are accelerated with energy of several keV or more so that the target material is irradiated therewith and melted, and the molten material moves in the gaseous state to thus be deposited on the substrate. The electron-beam physical vapor deposition process is advantageous in manufacturing a thin film of a high-melting-point ceramic such as oxide or the like because the target material may be heated to a high temperature within a short time compared to a resistance-heating deposition process using a filament or a sputtering process. Specifically, the present invention provides a method of manufacturing a rare-earth metal thin film by preparing a target with a solid rare-earth metal raw material in a vacuum chamber, vaporizing the target by melting the same using an electron beam, and depositing the vaporized target material on a substrate.

In the present invention, when a metal thin film is deposited on a member for a plasma etching device having a complex shape, a sputtering process is effective. Specifically, the sputtering process is widely used because a high-quality thin film may be easily obtained. In the sputtering process, a metal thin film and an insulator are stacked on a wafer. The principle of sputtering is a physical process similar to throwing a steel ball at a concrete wall. The colliding ball separates pieces having the same chemical and physical properties as concrete. When this process is repeated, the vicinity of the collision point is covered with concrete pieces. In sputtering, the 'steel ball' is an ionized argon atom, and the 'concrete wall' is the material plate to be sputtered, called a target. The sputtering process is performed in a vacuum chamber. Ionized argon is injected into a reaction chamber in which the target of the material to be sputtered and the wafer are located. The target is negatively charged, in contrast with the positively charged argon. Thus, the argon atom is accelerated, and the argon atom is not embedded into the target upon sputtering, unlike ion implantation. Rather, the argon atom collides in a manner similar to the steel ball and thus the target is slightly separated. Since the reaction chamber is in a vacuum state, the material that is separated is deposited all over the reaction chamber, including the wafer.

Rare-earth metals encompass 17 elements including lanthanides ranging from lanthanum (La) having atomic number 57 to ruthenium (Lu) having atomic number 71, scandium (Sc) having atomic number 21 and yttrium (Y) having atomic number 39. The rare-earth metal element used for the member of the present invention is preferably selected from the group consisting of Y, Sc, La, Ce, Pr, Nd, Sm, Eu, Gd, Tb, Dy, Ho, Er, Tm, Yb and Lu, and is more preferably selected from the group consisting of Y, Sm and Yb. These rare-earth metal elements may be used alone or in combinations of two or more.

In particular, yttria, which is yttrium oxide, has some advantages compared to quartz. First, yttria has a higher sputtering critical energy than quartz, and thus is better resistant to sputtering. Second, since yttria tends to form less volatile layers than quartz, an yttria thin film may last longer, and the average replacement time of the yttria thin film member may become longer. Third, yttria has a higher dielectric constant, on the order of 11, whereas quartz has a dielectric constant of approximately 3.5, which may achieve the desired bonding of RF between the ground extension and plasma.

An additional advantage of using the yttria thin film is that more effective use of a fluorine-containing process gas becomes possible. Specifically, in the case in which a carbon fluoride process gas is used for a quartz ring, the concentration of fluorine species at the edge of the wafer may be eliminated due to the formation of volatile compounds, which may lead to a lack of uniformity and lower edge etching rates when etching across the entire wafer substrate compared to the use of yttria rings. However, since an yttria thin-film member resists sputtering better than the quartz ring and does not easily form a fluorine compound, the use of the yttria thin-film member may further improve the critical width and etching rate uniformity across the entire wafer substrate and may generate more chemically uniform plasma.

The thickness of the rare-earth metal thin film is preferably 0.01 μm to 2.0 μm in order to increase the plasma resistance of the member for a plasma etching device of the present invention. Specifically, if the thickness of the rare-earth metal thin film is less than 0.01 μm, the depth of thermal diffusion of the rare-earth metal component is reduced, and thus a sufficient doping effect of the rare-earth metal component does not occur, so the effect of improvement in plasma resistance, which is desired in the present invention, is not sufficient. On the other hand, if the thickness of the rare-earth metal thin film exceeds 2.0 μm, it is not desirable from an economic point of view.

During the heat treatment in step b), the member for a plasma etching device is doped with the rare-earth metal through thermal diffusion in an atmosphere of ambient air, nitrogen, oxygen or argon, and the concentration of the final thermal diffusion layer may vary depending on the atmosphere.

The heat treatment in step b) is preferably performed at 1000° C. to 2000° C. As for a quartz member, if the temperature is lower than 1000° C., the rare-earth metal component does not sufficiently diffuse into the inner portion of the member. On the other hand, a temperature higher than 2000° C. is near the glass transition temperature, which may thus cause transformation into another phase. Furthermore, it is preferred that the heat treatment temperature conditions be set differently depending on the deposition atmosphere and the type of member for a plasma etching device.

In the rare-earth metal thin film, the temperature elevation characteristics, namely the temperature elevation rate and in-plane temperature distribution at the time of temperature elevation, may vary depending on the type of material and the thickness and properties thereof, and thus there is a need to adjust the heating time and the cooling time depending on the type of thin-film metal.

Moreover, it is possible to improve the durability of the rare-earth metal thin film by appropriately adjusting the heating time to reach the set temperature and the cooling time to reach room temperature after heat treatment.

The heat temperature in step b) is preferably performed for 2 to 40 hr, and more preferably 2 to 20 hr. If the heat treatment time is less than 2 hr, the depth of thermal diffusion of the rare-earth metal does not fall within the range from 0.1 μm to 10 μm. On the other hand, if the heat treatment time exceeds 40 hr, the physical properties of the member may deteriorate due to thermal deformation of the member for a plasma etching device.

Typically, a plasma processing device includes a reaction chamber, a gas supply unit that is installed inside the reaction chamber and supplies a source gas required to generate plasma gas into the reaction chamber, an electrode unit that serves as an electrode at the same time that the wafer is seated, and a gas spray unit for uniformly spraying the source gas supplied from the gas supply unit toward the wafer.

Also, the reaction chamber is provided with a viewport for observation of the inside of the chamber. The chamber viewport (also known as an end-point window) is a transparent part typically made of quartz or sapphire. Various optical sensors may be protected by the viewport, and optical sensor reading may be carried out through the viewport. Additionally, the viewport allows the user to visually inspect or observe the wafer during processing thereof. Both quartz and sapphire have poor plasma erosion resistance. Since plasma chemicals erode and roughen the viewport, the optical properties of the viewport change. For example, the viewport may be blurred and/or the optical signal passing through the viewport may be distorted. This may compromise the ability of the optical sensors to collect accurate readings. However, thick film protective layers may be unsuitable for use on the viewport because these coatings may block the viewport.

The outer appearance of the rare-earth metal thin film obtained through vacuum deposition in step a) exhibits metallic luster and lacks optical transmittance before heat treatment, whereas the surface of the member for a plasma etching device including the thermal diffusion layer of the rare-earth metal heat-treated in step b) loses metallic luster in outer appearance and is modified to become transparent.

Unlike an aerosol deposition process and a thermal-spraying process showing a color such as white after the formation of the film by maintaining the color of the original deposition material, in the present invention, the luster of the rare-earth metal component disappears through atmospheric heat treatment after deposition, and optical transparency appears, thus retaining the inherent optical properties of the member, whereby the member of the present invention may be utilized as an existing end-point analysis member. Moreover, it may be used as an accessory for a device requiring a window member, and long-term use of the device becomes possible due to the improved corrosion resistance of the window member.

The method of manufacturing the quartz member for a plasma etching device of the present invention is schematically shown in FIG. 2. When the quartz member on which the yttrium metal thin film is deposited is heat-treated within the heat treatment temperature range, the yttrium metal component moves to the inner portion of the quartz member due to a diffusion phenomenon of moving from a high concentration to a low concentration, and simultaneously, the silicon component present in the quartz member moves to the yttrium metal thin film. Consequently, the yttrium thin-film layer forms a ternary Y—Si—O thin-film layer composed of an yttrium metal component, a silicon component and an oxygen component, and the film doped with the rare-earth metal oxide is a coating layer that imparts etching resistance and plasma resistance to the surface of the quartz member.

In the present invention, the thickness of the thermal diffusion layer is the distance from the surface of the rare-earth metal thin film to the position at which the concentration of the main element of the member equals the concentration of the rare-earth metal by diffusing the rare-earth metal deposited through the heat treatment process in step b) to the inner portion of the member.

The thermal diffusion layer of the rare-earth metal, having a thickness of 0.1 μm to 10 μm, is formed through the above heat treatment on the surface of the member for a plasma etching device, and a Y—Si—O thin film or an Al—Y—O (YAG) thin film may be formed depending on the type of component of the substrate.

The member the surface of which is doped with the rare-earth metal component through heat treatment of the present invention is preferable because there is no change in electrical properties (breakdown voltage and dielectric value). Specifically, the geometrical structure of the edge ring and the material for the edge ring affect the etching rate profile. Here, when the dielectric value of the material for the edge ring of the plasma device changes, it is necessary to adjust the process parameters by changing the coupling to the lower electrode in the wafer edge region. However, in the present invention, by doping a portion of the quartz member with yttrium oxide, there is no change in dielectric value, so the likelihood of being required to change process parameters for controlling the etching rate profile may be minimized.

Also, the greater the mismatch of thermal expansion coefficients between two adjacent materials, the greater the likelihood that one of these materials eventually cracks or peels or that a bond to other materials is damaged. The existing film-forming process is a physical vapor deposition process, and thus the resulting film has a simple physical bond and is subject to the risk of stripping such as peeling or the like due to a difference in thermal expansion coefficient, but the thermal diffusion process causes no risk of peeling or the like due to chemical bonding.

In the thermal-spraying process, thermal stress is high due to a quenching effect, but in the corresponding technique, thermal stress of the material may be relieved by a kind of annealing effect through post-heat treatment, thus preventing the physical properties of the material from deteriorating. Unlike the thermal-spraying process, the surface of the quartz member is not imparted with roughness through a bead-blasting process, and it is suitable for long-term use because the material is not physically damaged.

By performing surface modification through simple deposition and heat treatment, compared to methods of changing materials, the method of the present invention may be a reasonable alternative in terms of cost and time.

A better understanding of the present invention will be given through the following examples. However, these examples are merely set forth to illustrate the present invention and are not to be construed as limiting the scope of the present invention.

Examples 1 to 3

In Examples 1 to 3, yttrium metal thin films were manufactured using components in the amounts shown in Table 1 below.

TABLE 1

| | Sub. | Film Material | Film Method | Film Thickness (μm) | Heat treatment Atmosphere | Heat treatment Temp. (° C.) | Heat treatment Time (hr) | Thermal diffusion thickness (μm) |
|---|---|---|---|---|---|---|---|---|
| Example 1 | Quartz | Y (yttrium) | EBPVD | 0.70 | Nitrogen | 1200 | 20 | 1.97 |
| Example 2 | Quartz | | | 0.10 | Ambient air | 1100 | 10 | 0.20 |
| Example 3 | Sapphire | | | 0.80 | Nitrogen | 1300 | 12 | 2.00 |

In order to analyze the element distribution of the above examples, the following experiment was performed.

Test Example 1—Secondary Ion Mass Spectrometry

The depth of thermal diffusion of the yttrium (Y) element of Example 1 and Example 2 was evaluated using secondary ion mass spectrometry (hereinafter referred to as "SIMS"). Specifically, in order to minimize the exposure of the protective film of a sample to ambient air, the sample was placed in a purge system, and a portion of the protective film of the sample was collected and mounted on a sample holder for SIMS. While maintaining the purged state, the sample holder was placed in a SIMS preparation chamber, the preparation chamber was pumped and placed in an experimental chamber, and the amounts of yttrium (Y), silicon (Si) and oxygen (O) were quantitatively analyzed using an oxygen ion gun to afford a depth profile graph.

The depth profile graphs of Example 1 and Example 2 are shown in FIGS. 3 and 4, respectively. It is considered that the positive ionization properties of the individual elements are superior to the negative ionization properties. Table 2 below shows more detailed analysis conditions.

TABLE 2

| Analysis conditions | Primary | Source: Cs+, HV: 10 kV, Current: 50 nA, Raster size: 120 μm × 120 μm |
|---|---|---|
| | Secondary | Sample HV: −5 kV Analysis area: 8 μm (Φ) |

Based on the results of SIMS, the yttrium (Y) atoms moved to the inner portion through a diffusion phenomenon after heat treatment, and the depth of thermal diffusion of yttrium (Y) in Example 1 was 1.97 μm, and the depth of thermal diffusion of yttrium (Y) in Example 2 was 0.20 μm.

Test Example 2—X-Ray Photoelectron Spectroscopy

The chemical bonding state and atomic content of samples before and after plasma treatment were measured using X-ray photoelectron spectroscopy (XPS) (Thermo Fisher Scientific, Al Kα (1486.6 eV) X-ray light source). The basic pressure of the sample chamber was adjusted to $10^{-9}$ torr, and during analysis, the range of $10^{-9}$ to $10^{-7}$ torr was maintained. The measured spectrum was represented as a plot of electron binding energy versus number of electrons at fixed, small-energy intervals. The peak area and peak height intensity coefficient were used for quantification. All surface compositions shown herein are represented as atomic percentages (atm %).

As shown in FIG. 5, Y 3d orbitals showed Y 3d3/2 and 3d5/2 peaks due to L-S coupling, and when yttrium oxide was formed, a 3d oxide peak was observed at a lower binding energy position due to chemical shifts. In FIG. 5(B), a Y 3d oxide peak was observed after heat treatment of the surface thereof, and in FIG. 5(D), a Y 3d oxide peak was also detected in the inner portion after heat treatment.

As shown in FIG. 6(A, B), after heat treatment of Example 3, the Y 3d peak was shifted to the high binding energy position, in which chemical shifts are low, while moving to the inner portion. The chemical shifts of binding energy are caused by chemical bonding with the Al element component in the sapphire member. In FIG. 6(C, D), it can be observed that the Al 2p peak position is diffused to the surface after heat treatment of Example 3. This is because the Al component present on the surface of the sapphire member is diffused into the Y film due to the thermal diffusion phenomenon.

Moreover, the depth of thermal diffusion of Example 3 was measured under the conditions shown in Table 3 below. Based on the results of analysis, it was confirmed that the depth of the thermal diffusion layer was 2.0 μm by converting the etching time to the Al-based diffusion layer of the member manufactured in Example 3.

TABLE 3

| | | Evaluation criteria | |
|---|---|---|---|
| Etching time | Beam Power | Material | Etching Rate |
| 10351 s | 3000 eV | $Ta_2O_5$ | 0.81 nm/sec |

Although specific embodiments of the present invention have been disclosed in detail as described above, it will be obvious to those skilled in the art that the description is merely of preferable exemplary embodiments and is not to be construed to limit the scope of the present invention. Therefore, the substantial scope of the present invention will be defined by the appended claims and equivalents thereof.

The invention claimed is:

1. A method of manufacturing a member for a plasma etching device, comprising:
   a) depositing a rare-earth metal thin film at a thickness of 0.01 μm to 2.0 μm on a substrate through vacuum deposition; and
   b) subjecting the substrate having the rare-earth metal thin film deposited thereon to heat treatment at 1100° C. to 1300° C. for 2 to 40 hr in an atmosphere of ambient air, nitrogen, oxygen or argon.

2. The method of claim 1, wherein the vacuum deposition is electron-beam physical vapor deposition (EBPVD) or sputtering.

3. The method of claim 1, wherein the rare-earth metal is at least one selected from among yttrium, ytterbium, and samarium.

4. The method of claim 1, wherein a material for the substrate has a melting point of 1000° C. or more.

5. The method of claim 1, wherein the substrate comprises any one selected from among quartz, sintered alumina, and sapphire.

6. The method of claim 1, wherein the heat treatment in step b) is performed for 2 to 20 hr.

* * * * *